United States Patent [19]

Gatti et al.

[11] Patent Number: 5,373,250
[45] Date of Patent: Dec. 13, 1994

[54] MESFET POWER AMPLIFIER AND ITS POWER SUPPLY UNIT, IN PARTICULAR FOR MICROWAVE SIGNAL AMPLIFICATION ON BOARD A SATELLITE

[75] Inventors: Giuliano Gatti, PV-Noordwijk, Netherlands; Tonicello Ferdinando, Verona, Italy; Ferruccio Denti; Alberto Battisti, both of Milan, Italy

[73] Assignee: Agence Spatiale Europeenne, Paris, France

[21] Appl. No.: 975,549

[22] PCT Filed: Aug. 7, 1992

[86] PCT No.: PCT/FR92/00781
§ 371 Date: Feb. 25, 1993
§ 102(e) Date: Feb. 25, 1993

[87] PCT Pub. No.: WO93/03541
PCT Pub. Date: Feb. 18, 1993

[30] Foreign Application Priority Data

Aug. 8, 1991 [FR] France .................. 91 10131

[51] Int. Cl.⁵ .................................. H03F 3/16
[52] U.S. Cl. .................. 330/277; 330/285; 330/297
[58] Field of Search ................ 330/277, 289, 297

[56] References Cited

U.S. PATENT DOCUMENTS 4,438,411 3/1984 Rubin et al. .................. 330/289
4,849,710 7/1989 Vo .

FOREIGN PATENT DOCUMENTS 0116492 8/1984 European Pat. Off. .
1559290 3/1969 France .
97411 5/1987 Japan .................. 330/289
54912 3/1989 Japan .................. 330/289
180106 7/1989 Japan .................. 330/289
280511 11/1990 Japan .................. 330/277

OTHER PUBLICATIONS

Temperature Compensation for Microwave GaAs FET Amplifiers, Lamberto Faffaelli and Rober Goldwasser, Microwave Journal, vol. 29, No. 5, May 1986, pp. 315–316, 318, 320, 321.
Review of Scientific Instruments, vol. 42, No. 5, Mai 1971, New York US pp. 714–715, M. K. Kopp, Wide Band Low Noise Voltage Sensitive Preamplifier with Temperature Compensation.

Primary Examiner—James B. Mullins
Attorney, Agent, or Firm—Sughrue, Mion, Zinn, Macpeak & Seas

[57] ABSTRACT

A power supply unit for a MESFET power amplifier is adapted to supply to the amplifier the voltages necessary for it to operate including a MESFET DC drain voltage. The power supply unit comprises a temperature-sensitive component near the MESFET(s) of the power circuit(s) so as to sense their temperature. A device slaved to a parameter delivered by the temperature-sensitive component varies the DC drain voltage in the same direction as the temperature varies so as to compensate by operation on the DC drain voltage the temperature-dependent antagonistic variation of gain and output power of the amplifier even if operating in saturation mode.

4 Claims, 5 Drawing Sheets

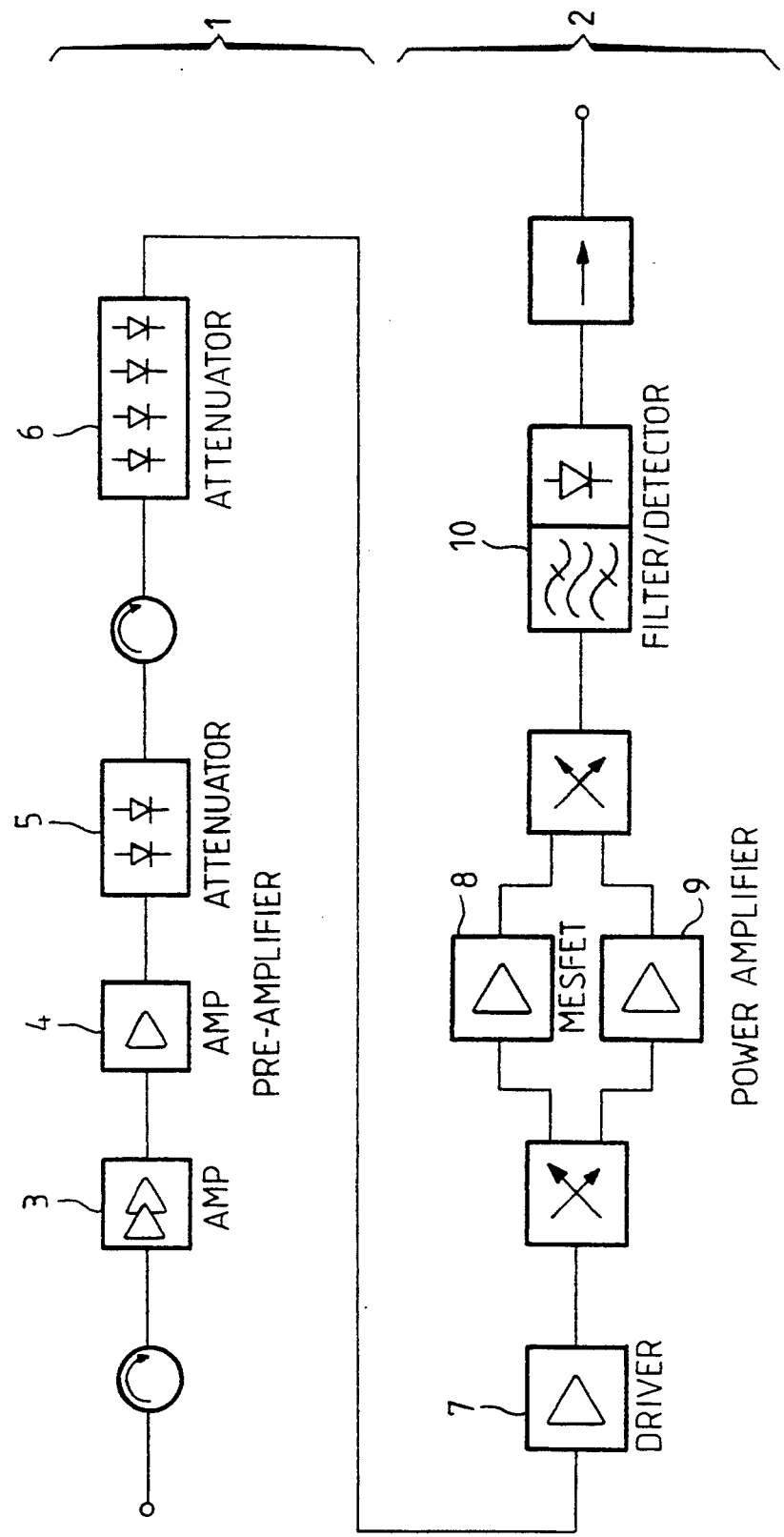

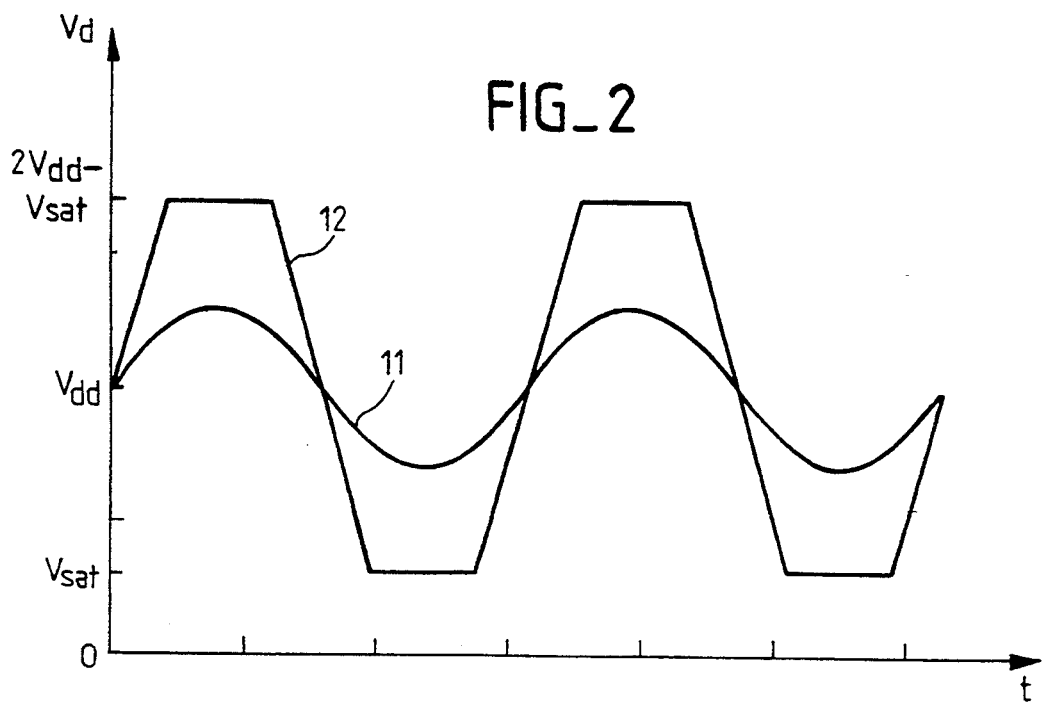
FIG_2
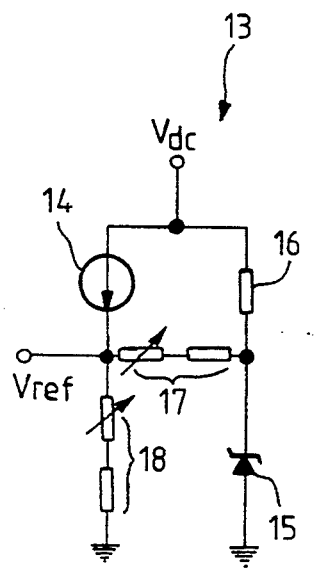
FIG_3
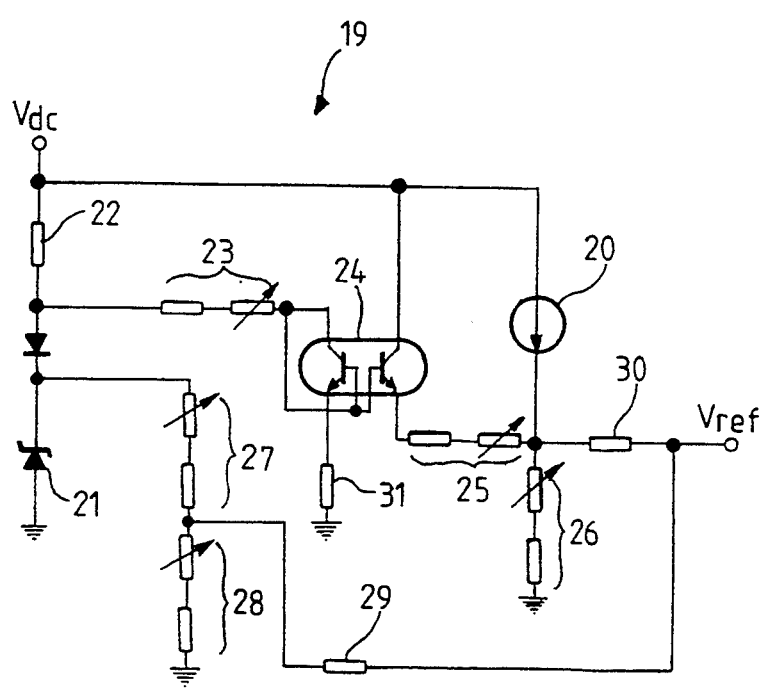
FIG_4

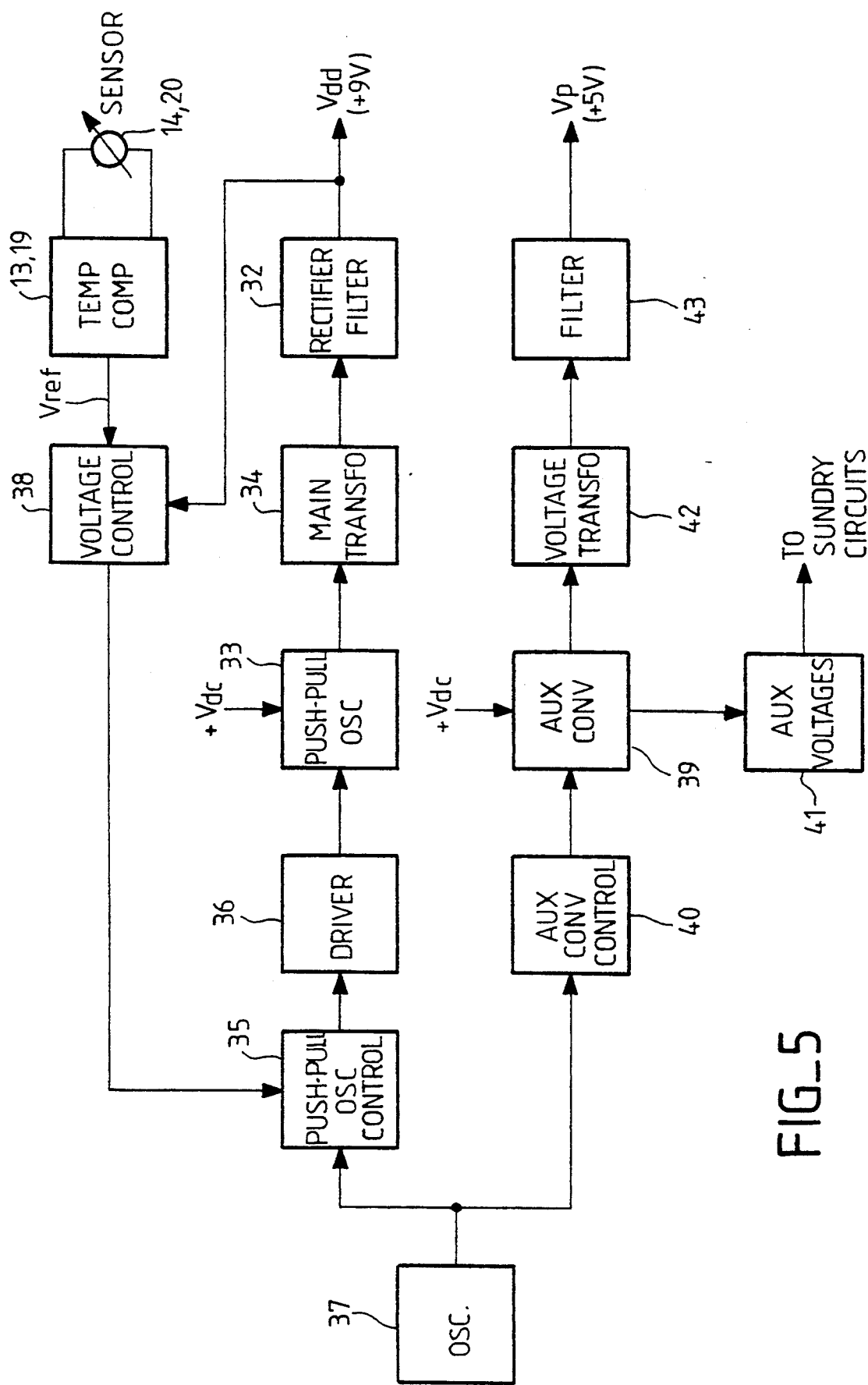
FIG_5

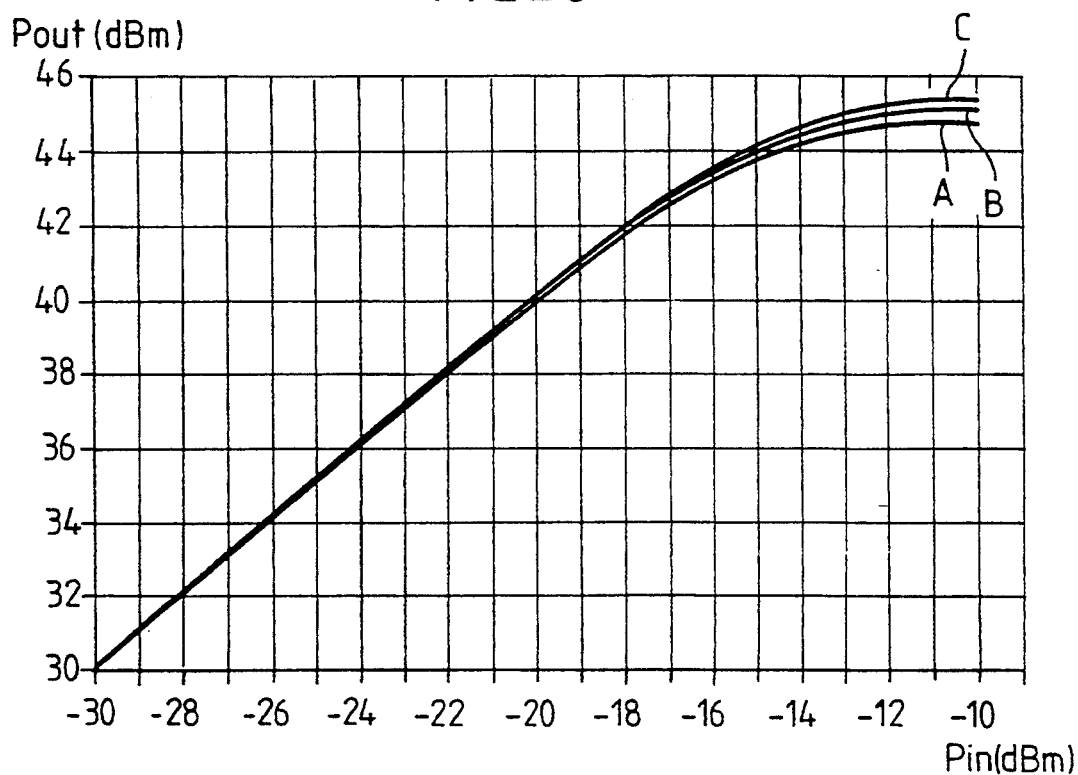
FIG_6
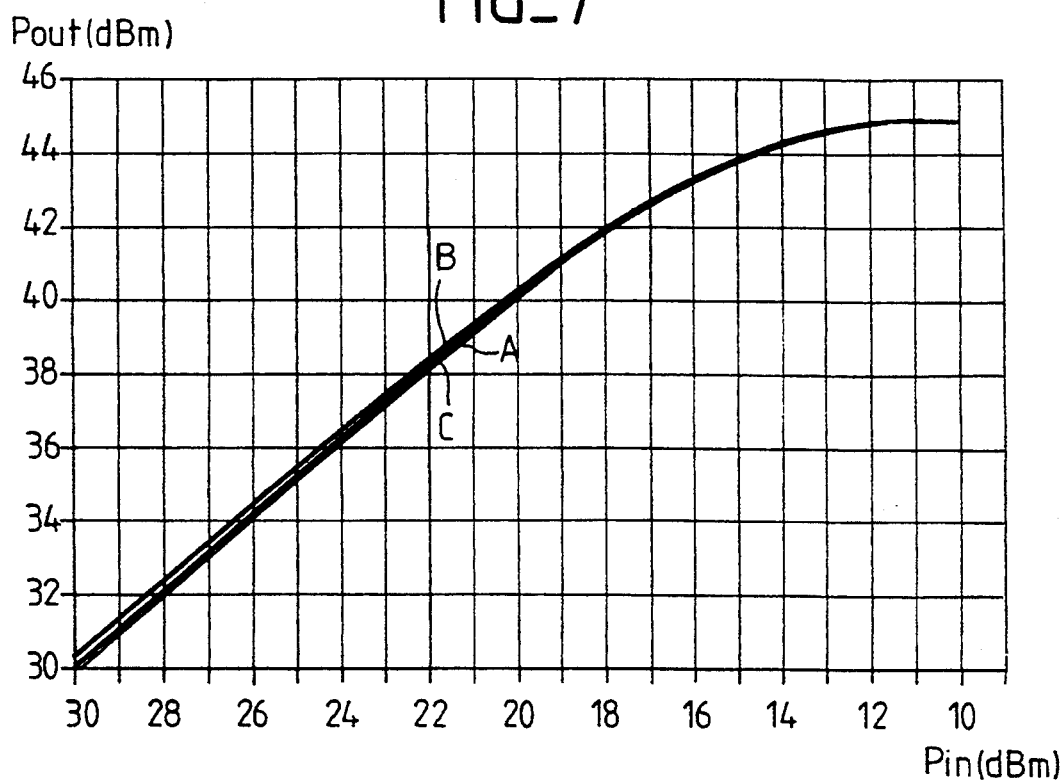
FIG_7

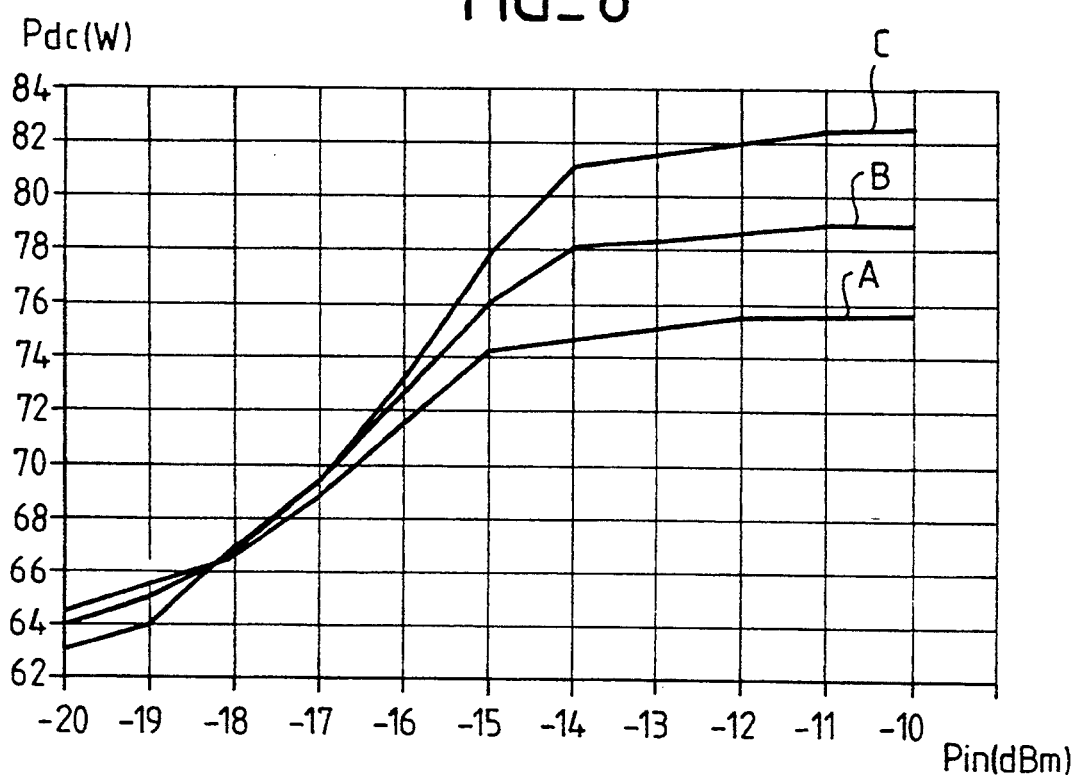
FIG_8
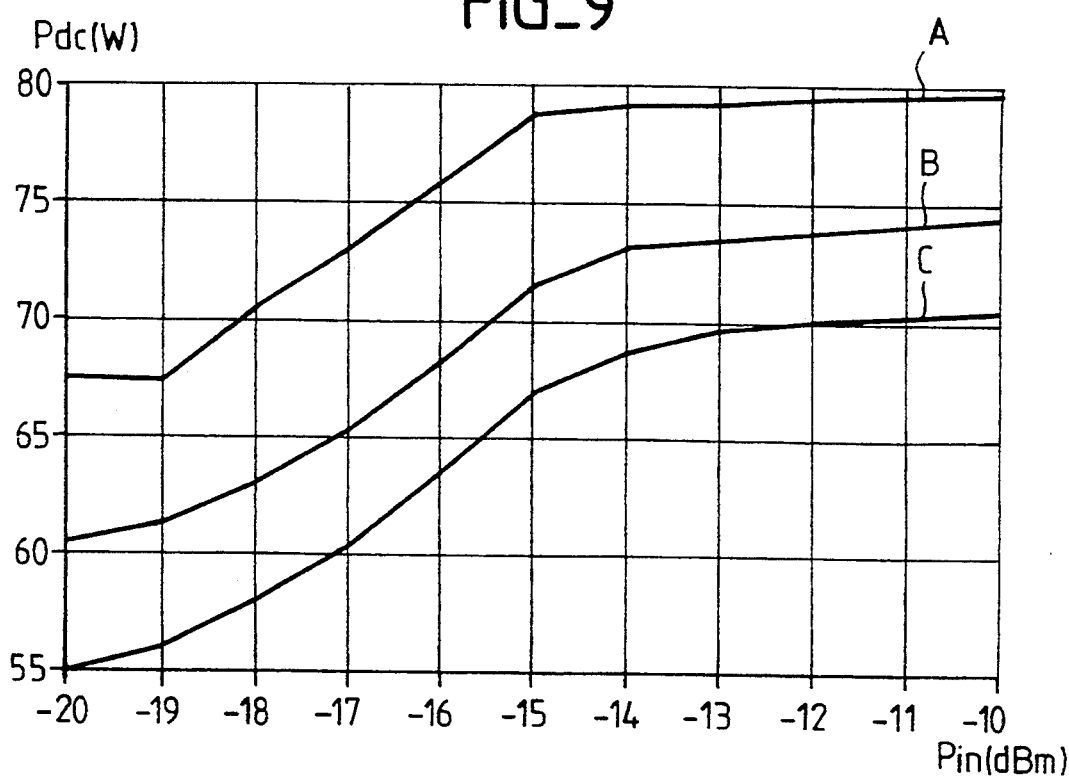
FIG_9

MESFET POWER AMPLIFIER AND ITS POWER SUPPLY UNIT, IN PARTICULAR FOR MICROWAVE SIGNAL AMPLIFICATION ON BOARD A SATELLITE

BACKGROUND OF THE INVENTION

1. Field of the Invention

The present invention concerns transistor power amplifiers or SSPA (Solid-State Power Amplifiers) and in particular amplifiers using MESFET (MEtal-Semiconductor Field-Effect Transistor) power devices.

2. Description of the Prior Art

These amplifiers are used in space applications i.e. satellites for the final radio frequency amplification stages especially for microwave signals, for example the signals driving a travelling wave tube (TWT) designed to transmit a highpower communication signal. Such amplifiers are particularly advantageous in this field because of their high intrinsic reliability, their low mass, their compact dimensions and the ease with which they can be adapted to different applications. MESFET are virtually universally used to amplify signals at frequencies above 1.5 GHz.

The amplifiers operate in one of two modes, depending on how sensitive the signals to be amplified are to non-linearities of the amplifier which themselves generate distortion.

In the first or linear mode, which must be used to amplify signals which are particularly sensitive to such non-linearities such as multiple carrier signals, the operating point of the amplifier is adjusted so that the amplifier always operates below its rated power output so that there is a safety margin and very little distortion from the input to the output.

In the second mode, which can be used to amplify signals which are less sensitive to non-linearities such as QPSK (Quadrature Phase Shift Keying) signals on a single carrier, the safety margin referred to above is dispensed with which significantly increases the output power of the amplifier but however also increases distortion. This mode is sometimes called "saturation" mode.

In either case the operating temperature of the amplifier significantly effects its characteristics. This is particularly critical in space applications given the very wide range of temperature variation routinely encountered: the case of amplifiers on board satellites, for example, the temperature of the transistors typically varies between −10° C. and +40° C., with frequent and relatively sudden heating/cooling cycles.

An increase in temperature reduces drift mobility and the maximum drift speed of the electrons in the MESFET channel, so reducing the transconductance of the component and the maximum channel current. Thus as the temperature increases the gain and the output power of the amplifier are reduced. At low temperatures, on the other hand, the contrary effect on the gain and the output power leads to excessive power consumption by the amplifier.

Techniques for compensating these temperature effects have already been proposed.

To be more precise, in a first family of known techniques the gain of the amplifier is compensated globally by operating on a pre-amplifier stage on the input side of the power amplifier. The pre-amplifier stage includes a circuit whose gain varies as a function of temperature in the opposite direction to the variation in the gain of the other circuits of the amplifier so as to compensate the overall gain of the latter. The variable gain circuit may be a variable attenuator or a variable gain amplifier controlled by a component responsive to temperature or an automatic gain control circuit controlled by a circuit measuring the output power of the amplifier (by means of a coupler, for example) and adjusting the gain of the pre-amplifier stage to maintain a constant output level and therefore a constant overall gain of the amplifier system.

However it is implemented, this technique is effective in the field of linear operation but becomes ineffective at saturation because of the insufficient dependency of output power on input power: when the amplifier saturates, variation of the level at the output of the pre-amplifier stage varies the output power only slightly.

A method of this kind is thus unable to compensate correctly for the effect of temperature variations on an amplifier operating in saturation mode.

Another known compensation technique, rather than operating on the overall gain of the amplifier system, operates individually on the various MESFETs by using a current control circuit to increase the drain current of each component as the temperature rises: because (in the linear region) the gain is proportional to the transconductance of the component which in turn depends on the drain current the increase in the drain current compensates for the temperature-dependent reduction of the gain.

Although this technique is effective in theory, it has various drawbacks including:

the need to provide a control circuit for each component, which renders the amplifier more complex and therefore less reliable, heavier and larger, all these characteristics being particularly critical in space applications, the slope of the drain current/temperature curve is not constant, but varies with frequency; thus this technique cannot be applied to broadband amplifiers unless further compensation of frequency variation effects is provided, for the highest temperatures a strongly increased drain current may produce an excessive channel temperature, reducing the reliability of the MESFET, finally, as in the previous case, this technique is applicable only if transistor operation is essentially linear.

It is thus clear that in each of these prior art techniques the gain of the amplifier is compensated, but only in the linear region. The output power variation is not compensated in the saturation region.

Unlike a bipolar transistor, the operating point of a MESFET cannot be controlled when the device is saturated by operating on the bias at the gate because control by the gate contact becomes less and less effective as saturation is approached. Any attempt to operate on the biasing of the saturated component entails the risk of damaging the component due to an excess gate current.

An object of the present invention is to alleviate these drawbacks and to this end to propose a new technique for compensating temperature effects in a MESFET amplifier which compensates for such effects completely, not only in the linear region but also—and especially—in the saturation region.

It will be shown that the effectiveness of the compensation technique in accordance with the invention is proportional to the degree of saturation, that it has only a very limited effect on reliability and that it does not cause any significant degradation of the efficiency of the power supply unit.

It will also be shown that the compensation technique in accordance with the invention is perfectly compatible with existing compensation techniques using a variable gain circuit. This possibility of simultaneous double compensation is particularly beneficial in applications where the same amplifier must operate in the linear region and in the saturated region, changeover from one operating mode to the other being remotely commanded. For example, in space applications some transmitters must be able to operate at very different output powers according to whether long-range or short-range transmission is required.

SUMMARY OF THE INVENTION

The present invention consists in a power amplifier suitable for amplifying microwave signals on board a satellite comprising:
at least one MESFET power circuit, and
a power supply unit adapted to supply to said at least one power circuit the voltages necessary for the latter to operate and including a DC drain voltage, said power supply unit comprising:
a temperature-sensitive component near the MESFET(s) of said at least one power circuit to sense their temperature, and
means slaved to a parameter delivered by said temperature-sensitive component to vary said DC drain voltage in the same direction as the temperature varies to compensate by operation on said DC drain voltage the temperature-dependent antagonistic variation of gain and output power of said at least one power circuit.

Advantageously the temperature-sensitive component is a current generator supplying a current substantially proportional to temperature and the means for varying the DC drain voltage comprise a constant voltage generator feeding a resistor network adapted to modify the voltage as a function of the current delivered by the current generator.

The invention also consists in a power amplifier comprising at least one MESFET power circuit and a power supply unit of the above type.

A detailed description follows of one embodiment of the invention, given with reference to the appended drawings.

BRIEF DESCRIPTION OF THE DRAWINGS

FIG. 1 is a diagrammatic representation of the various stages of a MESFET power amplifier to which the compensation technique of the invention may be applied.

FIG. 2 shows the voltage excursion at the drain of the MESFET for various input power levels to illustrate linear and saturated operation.

FIGS. 3 and 4 are respectively single ramp and double ramp temperature compensation circuit schematics.

FIG. 5 is a power supply unit schematic for an amplifier such as that from FIG. 1 incorporating a compensator circuit such as that from FIG. 3 or 4.

FIG. 6 and 7 are graphs showing for three different temperatures the output power of the amplifier as a function of the input power, respectively for a prior art amplifier and an amplifier compensated in accordance with the invention.

FIGS. 8 and 9 are counterparts of FIGS. 6 and 7 for the power consumed by the amplifier as a function of the input power.

DETAILED DESCRIPTION OF THE INVENTION

FIG. 1 is a diagrammatic representation of the various circuits constituting the amplifier.

The amplifier includes a pre-amplifier stage 1 driving a power stage 2. The pre-amplifier stage 1 comprises two consecutive amplifier circuits 3, 4 receiving the radio frequency signal to be amplified and two successive variable attenuator circuits 5, 6; the first variable attenuator 5 may be used to compensate for the variation in the gain of the amplifier in linear operation, using the prior art technique described above, the second variable attenuator 6 setting the gain of the amplifier and thus the output power level for constant input power.

The power stage 2 is conventional and comprises a circuit 7 driving two devices 8 and 9 in parallel simultaneously, the devices 8, 9 comprising power MESFETs; the output signals of these two devices are then fed to the radio frequency output, optionally via an appropriate filter/detector circuit 10.

FIG. 2 shows the variation in the drain voltage of a MESFET of the amplifier from FIG. 1, specifically a power stage transistor.

The instantaneous drain voltage $V_d$ varies about a DC drain voltage $V_{dd}$ as the applied gate signal varies.

In linear operation, i.e. for low input power levels applied to the amplifier, the output voltage excursion does not affect the waveform of the signal, which depends only on the gain of the component; thus a sinusoidal input signal produces a sinusoidal output signal 11 with very low distortion. In this situation the reduction of the output power as a function of the temperature, proportional to the excursion of the drain voltage $V_d$, may be compensated for by increasing the power applied to the input of the two devices in parallel by operating on the gain of the pre-amplifier stage 1, using the prior-art techniques explained above.

On the other hand, if the MESFET input level increases to the saturation level, the drain voltage $V_d$ is clipped at the saturation voltage $V_{sat}$ of the component in the negative-going half-cycles and by a voltage $2.V_{dd} - V_{sat}$ in the positive-going half-cycles. The output signal 12 is therefore highly distorted. In saturated operation the output power is only slightly dependent on the variation of the component input level, with the result that the compensation technique proposed above becomes ineffective or largely so.

To alleviate this limitation the invention proposes to slave the DC drain voltage $V_{dd}$ to temperature variations by increasing $V_{dd}$ when the temperature rises and vice-versa. The transconductance of the MESFET is thereby rendered substantially constant, with a correlative effect on the output level and on the overall gain of the system.

Note that the effectiveness of this compensation technique in accordance with the invention is proportional to the degree of saturation, in other words it increases as the output voltage waveform 12 approximates a square wave more and more closely, a small variation in the drain voltage then producing a very large variation in the output voltage.

The DC drain voltage $V_{dd}$ is essentially varied by incorporating into the amplifier power supply unit a temperature-sensitive circuit, for example a circuit for varying the reference voltage (set point value) controlling the drain voltage as a function of temperature using a ramp function of predetermined slope.

Note that this new compensation technique may be used in conjunction with a conventional compensation technique operating on the gain of the pre-amplifier stage and providing effective compensation in linear operation.

FIGS. 3 and 4 show two-examples of temperature-sensitive circuits, namely a single ramp circuit (FIG. 3) and a double ramp circuit (FIG. 4).

Each of these circuits supplies a reference voltage $V_{ref}$ to which the circuit setting the drain voltage $V_{dd}$ is slaved (this circuit will be described with reference to FIG. 5), the voltage $V_{ref}$ being adjusted in accordance with the temperature.

The single ramp circuit 13 in FIG. 3 comprises a temperature-sensitive component 14 which in this embodiment is a current generator integrated circuit (an Analog Devices AD590J, for example) producing a current that varies by approximately 1 μA per degree centigrade. This temperature-sensitive component is placed as close as possible to the transistor casing of the two parallel devices of the output stage; for example, it is fixed to the amplifier chassis in the immediate vicinity of these transistors. The circuit further comprises a voltage generator in the form of a Zener diode 15 biased by the resistor 16 connected to the voltage supply $V_{dc}$. Two series-connected variable resistors 17, 18 combine the respective effects of the current generator and the voltage generator and deliver a temperature-dependent reference voltage $V_{ref}$ whose slope and absolute value may be varied by adjusting the resistors 17 and 18 accordingly. For a bias voltage $V_{dc}$ of 12 V a circuit of this kind can produce a reference voltage $V_{ref}$ to which the DC voltage $V_{dd}$ applied to the drive circuit 7 and to the two parallel devices 8, 9 is slaved, this voltage varying between limits of 8.8 V (at 40° C.) and 7.8 V (at −10° C.), for example. These values represent a nominal voltage of approximately 8 V at ambient temperature.

If more precise temperature control is required a double ramp circuit like the circuit 19 of FIG. 4 may be used.

The circuit 19 comprises a current generator 20 identical to the generator 14 of the FIG. 3 circuit and a voltage generator comprising a Zener diode 21 and a bias resistor 22 identical to their counterparts 15 and 16 in FIG. 3 circuit. A double transistor 24 (2N2920, for example) operating in switching mode switches between the two ramps for varying the reference voltage $V_{ref}$: when the temperature is below a given threshold the reference voltage slope is determined by the circuit comprising the resistors 25 and 26 in parallel whereas for higher temperatures the righthand transistor of the double transistor 24 is turned off and the slope of the ramp is thereafter determined only by the resistor 26. The other components 23 and 27 through 31 of the circuit have functions such as production of an internal reference voltage, adjustment of the temperature for switching from one ramp to the other and adjustment of the absolute value of the reference voltage $V_{ref}$.

FIG. 5 is a block diagram of the power supply unit of the power stage of the amplifier.

The power supply unit comprises elements 32 through 43 which are known in themselves and which are therefore described in outline only together with various ancillary circuits (not shown) providing overload protection, filtering, remote supervision of unit operation, sequenced starting up, etc.

The DC drain voltage $V_{dd}$ is supplied by a rectifier and filter circuit 32 fed with the output voltage of a push-pull oscillator circuit 33 via a main transformer 34 providing the appropriate input level. The push-pull oscillator 33 is controlled by a circuit 35 via a driver circuit 36. The control circuit 35 feeds to the push-pull oscillator 33 the AC signal produced by an oscillator 37 and controls the push-pull oscillator 33 to maintain constant (at a given temperature) the DC drain voltage $V_{dd}$ using a control circuit 38 comparing the voltage $V_{dd}$ with a set point voltage $V_{ref}$ so that the drain voltage is slaved to this latter voltage.

According to the invention the set point voltage $V_{ref}$ is provided by a circuit 13 or 19 as shown in FIG. 3 or 4 so that the set point voltage can be modified according to the temperature detected by a sensor 14, 20.

The other circuits of the power supply unit deliver auxiliary voltages generated by a separate converter 39 controlled by the same oscillator 37 via a circuit 40, the converter delivering various auxiliary voltages through the circuit 41 and a bias voltage $V_p$ via a voltage transposer circuit 42 and a filter 43. These latter circuits, which are not relevant to the invention, are not described in detail.

FIGS. 6, 7, 8 and 9 show the performance that can be achieved using the invention. In all the figures the working frequency is 2.25 GHz. In FIGS. 6 and 8 the DC drain voltage $V_{dd}$ is fixed and equal to 8.5 V whereas in FIGS. 7 and 9 this voltage is variable: 7.8 V at −10° C., 8.2 V at 15° C. and 8.8 V at 40° C.

FIGS. 6 and 7 respectively show with and without the compensation technique of the invention the variation of the output power of the power amplifier as a function of the power applied to its input. The three curves A, B and C respectively relate to chassis temperatures of 40° C., 15° C. and −10° C. In FIG. 6 the temperature effects are compensated in the linear region by varying the gain of the pre-amplifier using the prior art technique but it is seen that this compensation becomes less and less effective the more closely saturation is approached, the peak variation exceeding 1 dB. On the other hand, by applying the technique of the invention the peak variation is less than 0.1 dB.

FIGS. 8 and 9 show the-variation in the power consumed by the amplifier as a function of the power applied to the input, adopting the same conventions as FIGS. 6 and 7. In the absence of compensation (FIG. 8), for the lowest temperature (−10° C., curve C) the maximum power consumption exceeds 82 W under saturation conditions whereas when the compensation technique of the invention is applied (FIG. 9) this power consumption does not exceed 79 W.

If it is required to reduce further the power consumption (which increases as the temperature falls, as previously explained) it is possible to operate on the compensation parameters to reduce consumption further at the cost of reducing efficiency. In the example just given the consumption could be reduced by more than 10 W relative to a non-compensated amplifier if a peak output power variation of 0.5 dB is acceptable.

Note further that, generally speaking, temperature compensation in accordance with the invention requires only a relatively small variation in the DC drain voltage (typically in the order of ±0.5 V between −10° C. and +40° C.) and the overall efficiency of the power supply unit is therefore virtually constant and is not effected by the additional compensation.

The control circuit 13 or 19 is of very simple design and consumes virtually no power itself with the result that it does not degrade the reliability or efficiency of the power supply unit.

With regard to the possible effect of the compensation on the reliability of the amplifier, first results indicate that the increased drain voltage at the highest temperatures could entail the risk of reducing MESFET reliability; in reality, at these higher temperatures the drain voltage is increased but the drain current is reduced because of the reduced transconductance of the component; the increase in the drain voltage (which in any event is very small, in the order of 0.5 V) therefore does not modify significantly the junction temperature and has virtually no effect on the reliability of the component.

There is claimed:

1. A power amplifier suitable for amplifying microwave signals on board a satellite comprising:
    at least one metal-semiconductor field effect transistor power circuit, and
    a power supply unit supplying to said at least one power circuit voltages necessary for the latter to operate and including a DC drain voltage, said power supply unit comprising:
    a temperature-sensitive component near said at least one metal-semiconductor field effect transistor of said at least one power circuit to sense its temperature, and
    means slaved to a parameter delivered by said temperature-sensitive component to vary said DC drain voltage in the same direction as the temperature varies to compensate by operation on said DC drain voltage the temperature-dependent antagonistic variation of gain and output power of said at least one power circuit, wherein said temperature-sensitive component comprises a current generator supplying a current substantially proportional to temperature and said means for varying said DC drain voltage comprises a constant voltage generator feeding a resistor network to modify said DC drain voltage as a function of the current delivered by said current generator.

2. A power amplifier according to claim 1 comprising a second resistor network switched selectively as a function of temperature.

3. A power supply unit for a metal-semiconductor field effect transistor power amplifier to supply to said amplifier voltages necessary for it to operate including a DC drain voltage, said power supply unit comprising:
    a temperature-sensitive component near a semi-conductor field effect transistor of said at least one power circuit to sense its temperature, and
    means slaved to a parameter delivered by said temperature-sensitive component to vary said DC drain voltage in the same direction as the temperature varies to compensate by operation on said DC drain voltage the temperature-dependent antagonistic variation of gain and output power of said at least one power circuit, wherein said temperature-sensitive component comprises a current generator supplying a current substantially proportional to temperature and said means for varying said DC drain voltage comprises a constant voltage generator feeding a resistor network to modify said DC drain voltage as a function of the current delivered by said current generator.

4. Power supply unit according to claim 3 comprising a second resistor network switched selectively as a function of temperature.

* * * * *